US008249740B2

(12) United States Patent
Sohmshetty et al.

(10) Patent No.: US 8,249,740 B2
(45) Date of Patent: Aug. 21, 2012

(54) COMPUTER-IMPLEMENTED METHOD AND SYSTEM FOR DETERMINING A MATERIAL UTILIZATION FOR PART ASSEMBLIES

(75) Inventors: Raja Shekar Sohmshetty, Canton, MI (US); Shawn Michael Morgans, Chelsea, MI (US); Zhiyong Cedric Xia, Canton, MI (US); Lawrence J. Dupuis, Grosse Ile, MI (US); Amir T. Chator, Farmington Hills, MI (US)

(73) Assignee: Ford Motor Company, Dearborn, MI (US)

( * ) Notice: Subject to any disclaimer, the term of this patent is extended or adjusted under 35 U.S.C. 154(b) by 364 days.

(21) Appl. No.: 12/581,939

(22) Filed: Oct. 20, 2009

(65) Prior Publication Data

US 2011/0093107 A1    Apr. 21, 2011

(51) Int. Cl.
 *G06F 19/00* (2011.01)
(52) U.S. Cl. .................... 700/171; 700/28; 700/97
(58) Field of Classification Search .......... 700/28, 700/36, 97, 106, 107, 171; 705/29
 See application file for complete search history.

(56) References Cited

U.S. PATENT DOCUMENTS

| 5,552,995 | A | 9/1996 | Sebastian |
| 7,590,937 | B2 | 9/2009 | Jacobus et al. |
| 7,716,019 | B2 * | 5/2010 | Liu .................................. 703/1 |
| 2002/0013631 | A1 | 1/2002 | Parunak et al. |
| 2005/0209732 | A1 | 9/2005 | Audimoolam et al. |
| 2007/0016432 | A1 | 1/2007 | Piggott et al. |
| 2009/0204237 | A1 | 8/2009 | Sustaeta et al. |
| 2011/0172794 | A1 | 7/2011 | Sohmshetty et al. |

OTHER PUBLICATIONS

"Automotive Steel Design Manual"; May 1996; pp. 1-42.*
G.Q. Huang, et al., Design for Manufacture and Assembly on the Internet, Computers in Industry 38 (1999) 17-30, 0166-3615/99, 1999 Elsevier Science B.V.
D. Anderson, Masters of Science Graduate Student, Concurrent Engineering in Manufacturing, Submitted in Partial Completion of the Requirements of IDEN 5303, Advanced Manufacturing Systems Design, Fall 1999.

* cited by examiner

*Primary Examiner* — John R. Cottingham
*Assistant Examiner* — Chad Rapp
(74) *Attorney, Agent, or Firm* — Raymond L. Coppiellie; Brooks Kushman P.C.

(57) ABSTRACT

Various embodiments may include determining a material utilization for one or more assemblies having a plurality of parts. Offal data for one or more parts comprising one or more part assemblies and a blank material utilization status for each of the one or more part assemblies may be received. The blank material utilization status for the one or more part assemblies may be based on a blank material utilization status for each of the one or more parts. The offal data may be standardized to obtain standardized offal data. One or more offal utilization assignments for the part assemblies having a plurality of parts may be determined based on the standardized offal data and the blank material utilization status for the part assemblies. The offal utilization assignments may then be transmitted for assignment to the one or more part assemblies.

18 Claims, 7 Drawing Sheets

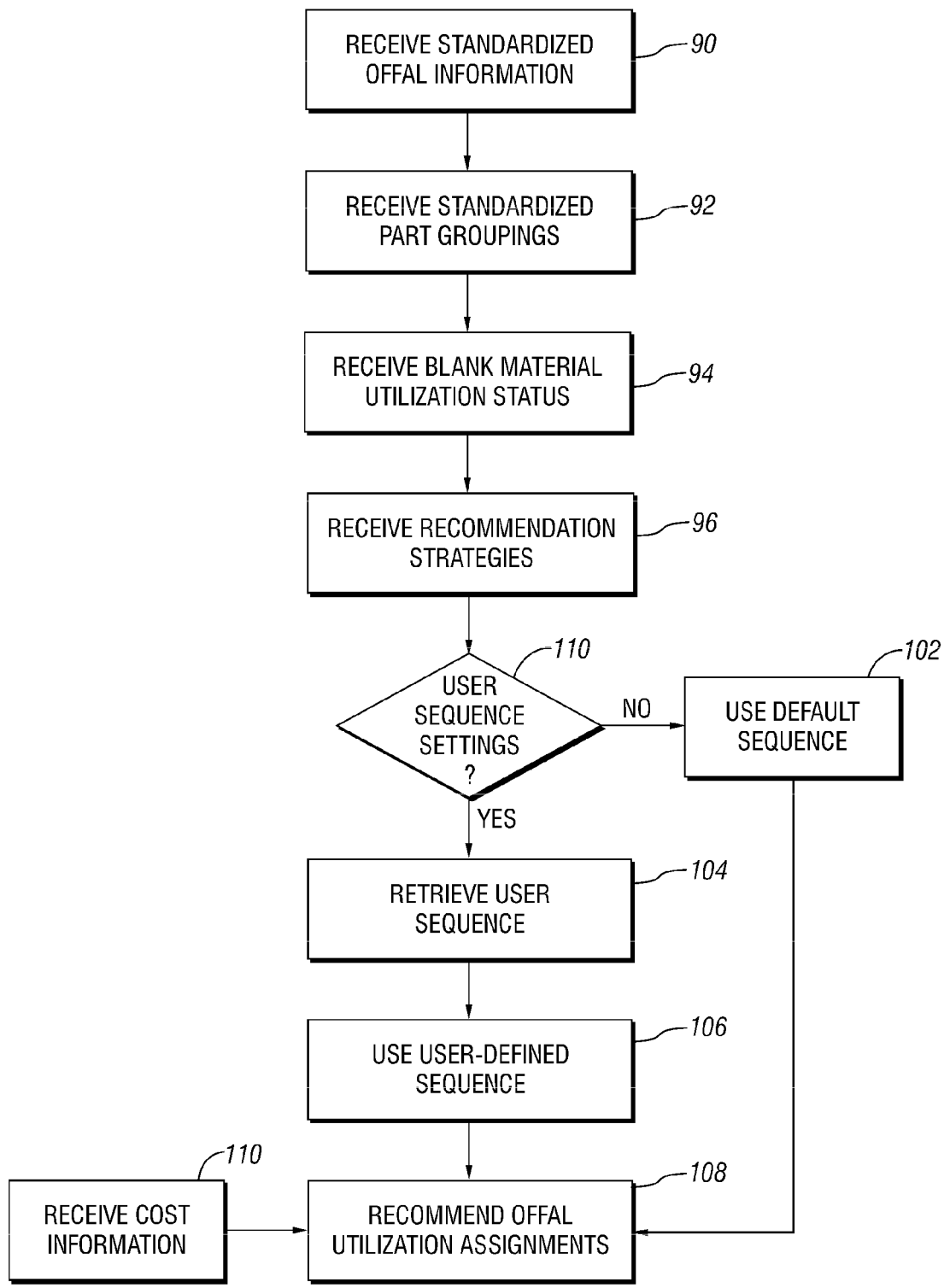

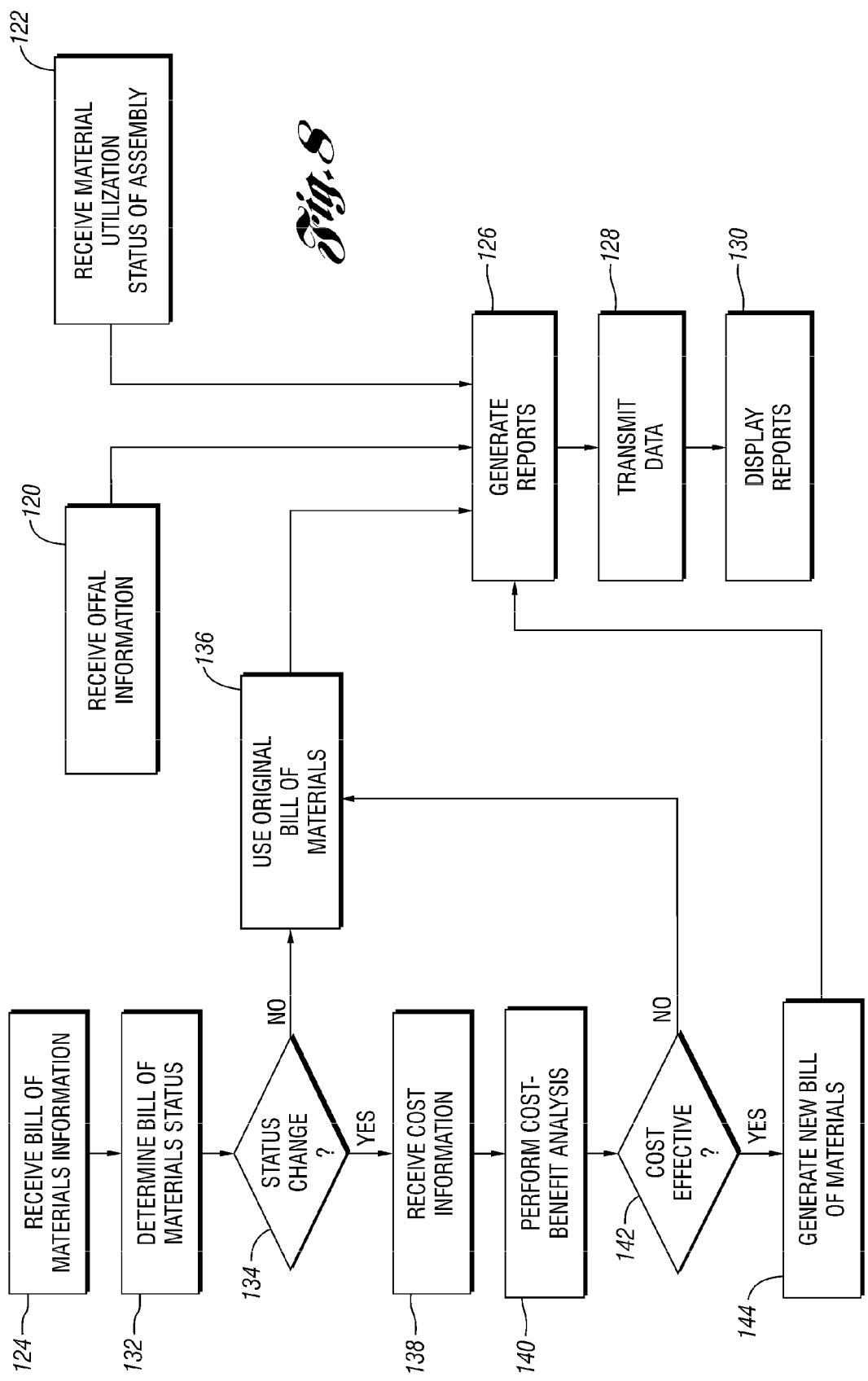

COMPUTER-IMPLEMENTED METHOD AND SYSTEM FOR DETERMINING A MATERIAL UTILIZATION FOR PART ASSEMBLIES

BACKGROUND

1. Technical Field

One or more embodiments include a computer-implemented method and system for determining a material utilization for part assemblies. Some embodiments include a method and system for determining a material utilization for one or more vehicle part assemblies.

2. Background Art

Typically, maximizing material utilization during a part design process occurs on a part-by-part process. In this typical process, product (e.g., vehicle) manufacturers determine cost effective methods to maximize the utilization of material blanks. Blanks include the raw material (e.g., steel) from which a product part may be manufactured (i.e., stamped).

Based on this determination, each part may be stamped out of the material blanks. The remainder of the blank, also known as an "offal," is generally waste and, therefore, discarded.

Blanks are purchased by a product manufacturer from material suppliers in a manner similar to the way consumers purchase materials (e.g., fabric). That is, product manufacturers purchase materials according to particular measurements. For example, product manufacturers may provide a thickness or coil width for the material.

In some instances, suppliers provide materials according to particular specifications based on either the agreement between the supplier and the manufacturer or based on industry standards. Accordingly, product manufacturers generally cannot order materials according to the specifications of the parts being manufactured. Due to this limitation and the fact that blank utilization is a part-by-part determination, the stamping process results in the generation of many offals that may go unused by the product manufacturer.

SUMMARY

One aspect includes a computer-implemented method for determining a material utilization for one or more assemblies having a plurality of parts. The method may include receiving offal data for one or more parts comprising one or more part assemblies and receiving a blank material utilization status for each of the one or more part assemblies. The blank material utilization status for the one or more part assemblies may be based on a blank material utilization status for each of the one or more parts.

In one embodiment, the one or more part assemblies may be for different vehicle programs.

The method may further include standardizing the offal data to obtain standardized offal data. The standardizing step may further include standardizing the offal data in response to one or more user inputs to obtain standardized offal data.

The method may further include determining one or more offal utilization assignments for the one or more part assemblies having a plurality of parts. The determination may be based on the standardized offal data and the blank material utilization status for the one or more part assemblies. In one embodiment, the determination may be made during a design phase of one or more vehicles.

In one embodiment, the one or more user inputs may include one or more criteria for standardization. As such, the determination may further include determining the offal utilization assignments based on the standardization criteria.

Additionally, the method may further include transmitting the one or more offal utilization assignments for assignment to the one or more part assemblies.

In one embodiment, the method may further include receiving and standardizing part groupings data to obtain standardized part groupings data. The method may further include determining the one or more offal utilization assignments additionally based on the standardized part groupings data. The part groupings data may be standardized in response to one or more user inputs including, but not limited to, one or more part grouping tolerances such as a thickness tolerance and a strength tolerance.

In one embodiment, the method may further include receiving one or more offal utilization assignment strategies and recommending the one or more offal utilization assignments based on the one or more offal utilization assignment strategies. Furthermore, user input defining a ranking for applying the one or more offal utilization assignment strategies may be received such that the one or more offal utilization assignments strategies are applied based on the ranking. The one or more offal utilization assignment strategies may be applied sequentially or in parallel.

A second aspect includes a computer-implemented system for maximizing a material utilization for one or more assemblies having a plurality of parts. The system may include at least one computer. The at least one computer may include a plurality of computers communicating in a distributed computing system.

The at least one computer may be configured to receive offal data for one or more parts related to one or more part assemblies and receive a blank material utilization status for each of the one or more part assemblies. The blank material utilization status for the one or more part assemblies may be based on a blank material utilization status for each of the one or more parts. Furthermore, the offal data may be computer-aided design (CAD) data.

In one embodiment, the at least one computer configured to receive the offal data may be further configured to update the offal data.

The at least one computer may be further configured to receive data representing one or more part groupings.

The at least one computer may be further configured to standardize the offal data and the part groupings data to obtain standardized offal data and standardized part groupings data.

The at least one computer may be further configured to determine one or more offal utilization assignments for one or more part assemblies having a plurality of parts based on the standardized offal data, the standardized part groupings data, and the blank material utilization status for the one or more part assemblies. Additionally, the at least one computer may be further configured to transmit the one or more offal utilization assignments for assignment to the one or more assemblies.

In one embodiment, cost information for manufacturing the one or more part assemblies may be received. Thus, the at least one computer may be further configured to determine the one or more offal utilization assignments for the one or more part assemblies based on the standardized offal data, the standardized part groupings data, the blank material utilization status, and the cost information. The cost information may include at least one of a parts cost, a tooling cost, and a transportation cost.

In one embodiment, the at least one computer may be further configured to receive bill of materials information for the one or more assemblies. Additionally, the at least one computer may be further configured to receive and apply one or more offal utilization assignment strategies for use in determining the one or more offal utilization assignments.

For each offal utilization assignment strategy, the at least one computer may be further configured to determine if the bill of materials information needs revision. If revisions is needed, the at least one computer may be further configured to revise the bill of materials information.

Another aspect includes a computer program product embodied in a computer-readable medium for maximizing a material utilization. The computer program product may include instructions for receiving an assembly blank material utilization (BMU) status based on a part BMU status. Additionally, the computer program product may include instructions for receiving offal data for one or more parts. The computer program product may also include instructions for standardizing the offal data and receiving the standardized offal data. The computer program product may also include instructions for determining an offal utilization assignment for one or more part assemblies based on the standardized offal data and the assembly BMU status.

These and other aspects of the present invention will be better understood in view of the attached drawings and following detailed description of the invention.

BRIEF DESCRIPTION OF THE DRAWINGS

The features of the present invention which are believed to be novel are set forth with particularity in the appended claims. The present invention, both as to its organization and manner of operation, together with further object and advantages thereof, may best be understood with reference to the following description, taken in connection with the accompanying drawings, in which:

FIG. 7 illustrates a method for assigning one or more offals for one or more part assemblies according to another one of the various embodiments; and FIG. 8 illustrates a method for assigning and reporting offal assignments according to one of the various embodiments.

DETAILED DESCRIPTION

As required, detailed embodiments of the present invention are disclosed herein. However, it is to be understood that the disclosed embodiments are merely exemplary of an invention that may be embodied in various and alternative forms. Therefore, specific functional details disclosed herein are not to be interpreted as limiting, but merely as a representative basis for the claims and/or as a representative basis for teaching one skilled in the art to variously employ the present invention.

Maximizing the utilization of a blank in the design and manufacturing of one or more part assemblies may lead to incremental cost savings for a product manufacturer. This may be accomplished using software having programmable code that algorithmically recommends an offal utilization using, in one or more embodiments, blank material utilization status information, standardized offal information and standardized part grouping information.

Figure 1:
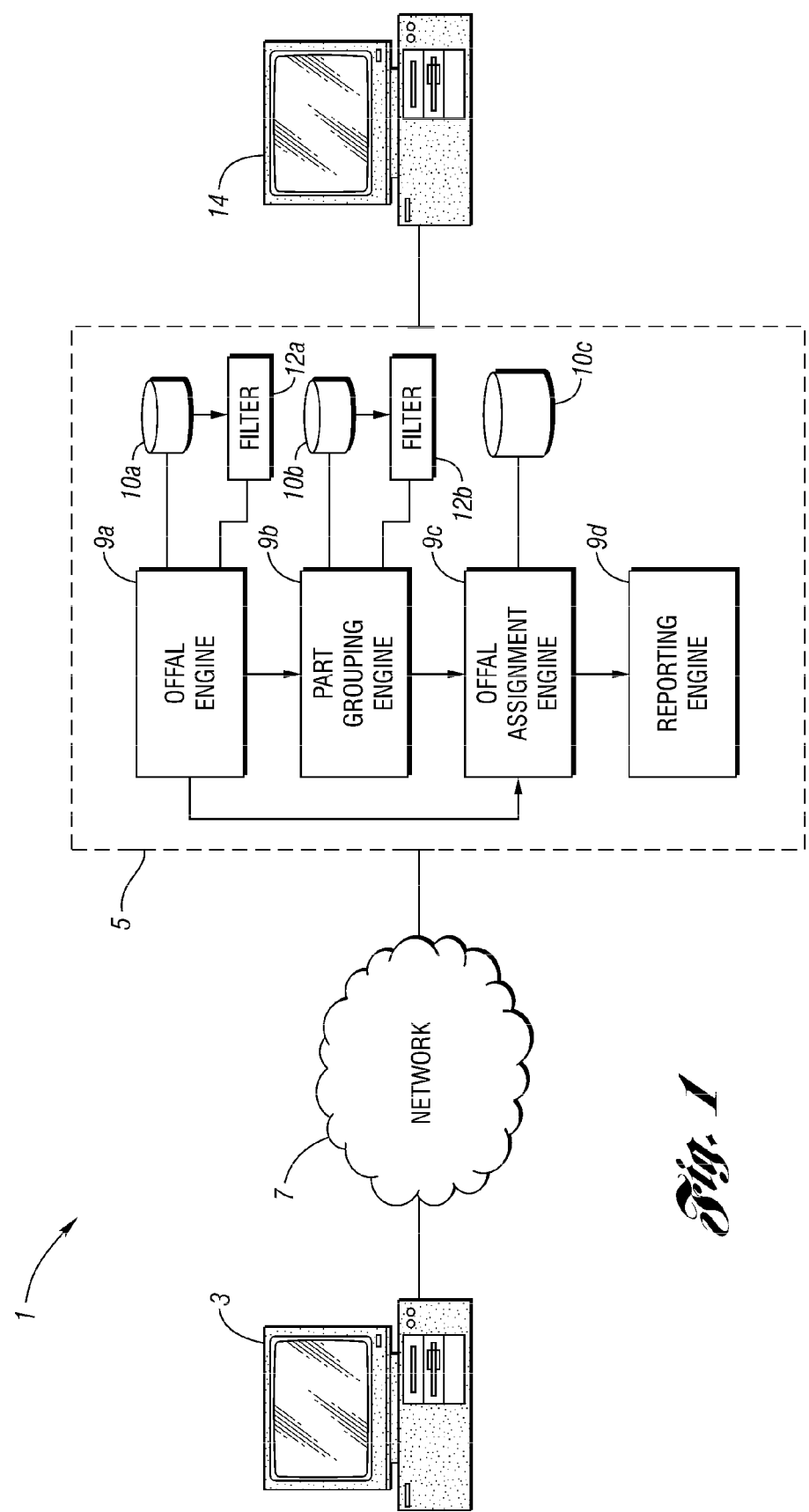
FIG. 1 illustrates a multivehicle, multipart material utilization maximization system according to one of the various embodiments.

FIG. 1 illustrates one of the various embodiments of a system for maximizing a material utilization for multiple parts in multiple vehicles. More specifically, system 1 may be used to determine maximum utilization of one or more offals in the design and production of an assembly.

System 1 may or may not be a distributed computing system. Terminal 3 may be a nomadic device (e.g., a PDA or other wireless device capable of communicating over an Internet connection) or a personal computer (PC) such as a desktop or laptop. Terminal 3 may be utilized by a general user. A general user is an end user of the system 1. For example, the general user may input information to and receive information from the terminal 3. Terminal 3 may also include a graphical user interface (GUI) display.

In one embodiment, system 1 may also include terminal 14 utilized by an administrator of system 1. An administrator may be responsible for the regular maintenance and development of system 1. For example, an administrator may update (e.g., add, delete or modify) the algorithms stored on engines 9a-d. An administrator may also be responsible for providing general user access to system 1 (e.g., generating login information and authorization levels).

Terminal 3 and terminal 14 may communicate with a server 5 over network 7 for exchanging information between terminal 3, 14 and server 5. In one non-limiting embodiment, system 1 may be an Internet-based system. Accordingly, network 7 may be a web network and server 5 may be a web server. Furthermore, it should be understood that terminal 3 and terminal 14 may use the same network 7 or different networks.

The information exchanged between terminal 3 and server 5 may be received by and/or transmitted from one or more engines 9a-d in communication with server 5. In one embodiment, engine(s) 9a-d may be stored in the server's 5 non-volatile memory.

Engine(s) 9a-d may be software engines for maximizing material utilizations in designing and producing one or more assemblies having a number of parts. The material utilizations may be with respect to a utilization of the offals that are generated as part of producing one or more assemblies (e.g. and without limitation, an automotive body-in-wide).

A material utilization maximization determination may be accomplished in a plurality of phases. As represented in FIG. 1, one or more separate engines may be used in each phase. It should be understood, however, that engine(s) 9a-d may be one engine or a plurality of engines as may be practiced in the art. For illustration purposes, system 1 includes a plurality of engines. Furthermore, the one or more phases may be performed sequentially or concurrently.

Figure 2:
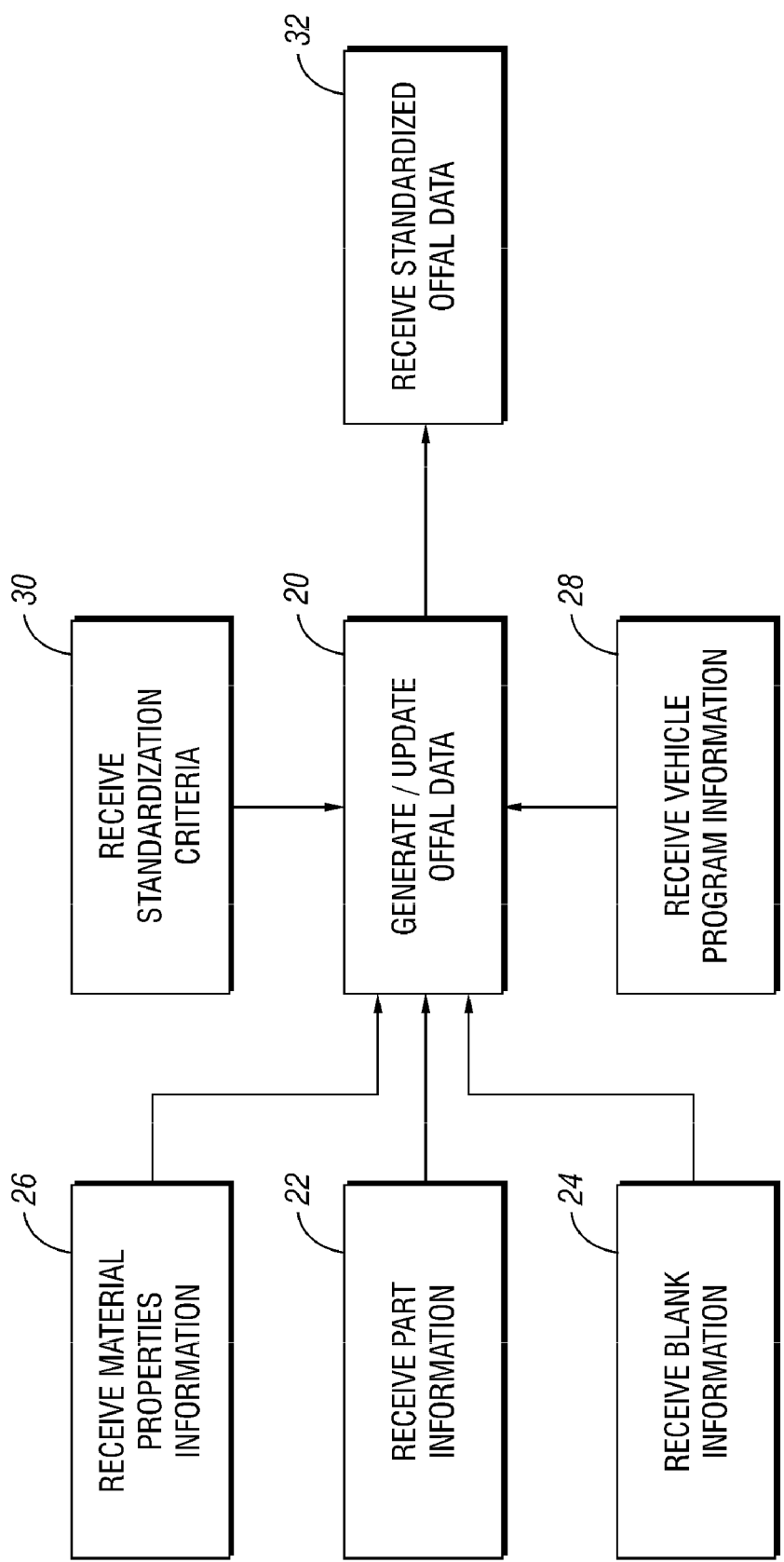
FIG. 2 illustrates a method for generating offal data according to one of the various embodiments.
Figure 3:
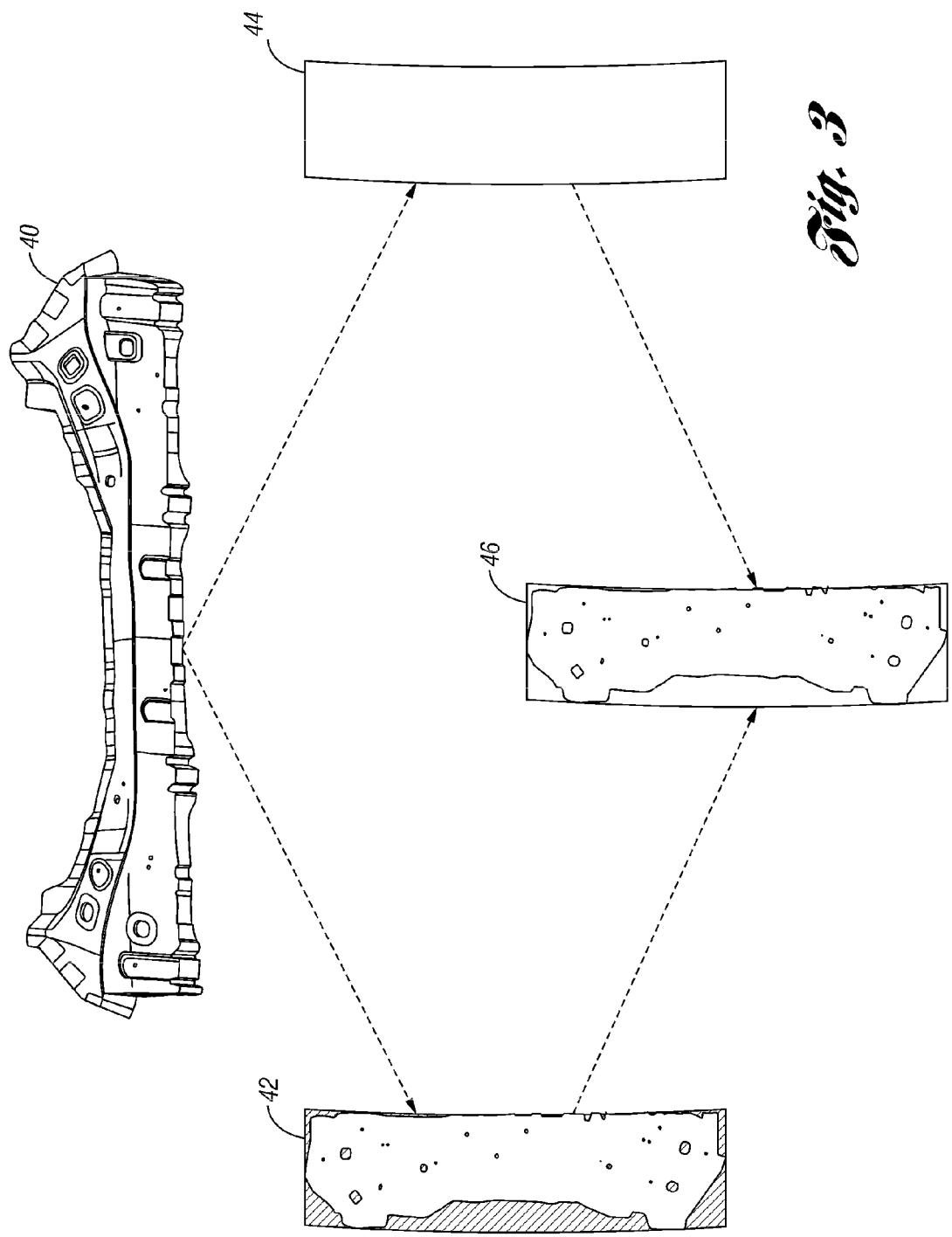
FIG. 3 illustrates a part blank and an offal for a part according to one of the various embodiments.
Figure 4:
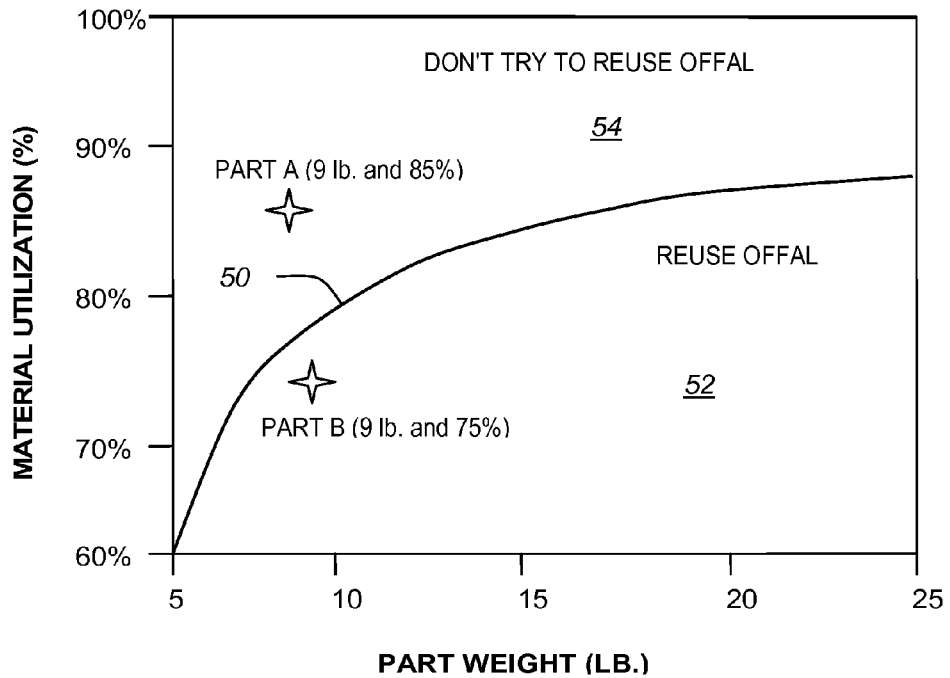
FIG. 4 shows a method for standardizing offal information according to one of the various embodiments.

Engine 9a, the operation of which is described with respect to FIGS. 2, 3 and 4, may receive data about one or more offals. The offal data generated or updated by engine 9a, as illustrated in block 20, may be based on data received from a plurality of sources for generating and/or updating the offal data. Computer-aided design (CAD) data including, but not limited to, vehicle part geometries (block 22) and blank material geometries (block 24), may be received for generating offal data. The part information (block 22) may also include material utilization values for one or more parts.

FIG. 3 is an exemplary illustration of the CAD data according to one of the various embodiments. Block 40 is a CAD illustration of a part to be manufactured. Block 42 represents the generated offal CAD data from the part to be manufactured. Block 46 is a CAD illustration of the unfolded geometry of the part to be manufactured and block 44 is a CAD illustration of a blank material geometry of the part to be manufactured.

Referring back to FIG. 2, additional data may be received by engine 9a. Information on material properties may be received for associating a material property with each offal as illustrated in block 26. Material properties information may include, but is not limited to, a material thickness and materials yield strength for one or more parts. In one embodiment, material properties information may be received from a materials properties database (not shown).

The offal data may also be associated with one or more vehicle programs (e.g., Ford F-150 or Ford Focus) received from a vehicle program source as illustrated in block 28. In one embodiment, bill of materials data may also be used in generating offal data.

Information from these sources may serve as inputs to engine 9a for generating or updating offal data as illustrated in block 20. The generated or updated offal data may be stored in one or more offal database(s) 10a. In one embodiment, portions of the offal data may be saved on a computer spreadsheet.

The offal data may also include information identifying the offals. Non-limiting examples may include the offal's weight, area, perimeter, dimensions and thickness. The offal information may also include the original part from which it originated. This information may be received by engine 9d and generated in a report (described in detail below).

A filter engine 12a in communication with engine 9a may filter the offal data, as illustrated in block 30, and generate a standardized collection of offal data. The standardized offal data may be generated before or after the offal data is stored in database 10a. Non-limiting examples of filters used by filter engine 12a may include a cost for an offal, a weight of the offal, the offal's area, or suppliers of the part from which the offal is generated. One or more filter criteria may be inputted by a general user from terminal 3.

In one embodiment, a general user may input data for a cost filter. Filter engine 12a may standardize the offal data based on the offal's weight or the offal's area with respect to the offal's cost. Thus, the standardized offal data output may be a weight or area of the offal based on cost of the offal. Engine 9a may include computer-executable instructions for converting cost information into weight and/or area information. The conversion may be based on cost estimates negotiated between an original equipment manufacturer (e.g., a vehicle manufacturer) and one or more suppliers. The cost estimate conversion formula may be programmed to engine 9a. Alternatively or additionally, the cost and weight/area information may be stored as separate data fields in a part information database (not shown) or in the material properties data source communicating with engine 9a from which the filter engine 12a may retrieve the weight/area information based on cost.

A non-limiting example of a cost filter inputted by a general user may be to retrieve from the data set any offals that are greater than or equal to ten cents per offal. In order to maximize offal usage, the filter engine 12 may be pre-programmed (e.g., by the OEM) to filter the data set based on the largest pre-defined shape that can be generated from one or more blanks from which the offals originate. Accordingly, if the price of a material is $1.00 per pound, the filter engine 12 may remove from the dataset any offals that weigh less than 0.1 pounds. If the data is standardized based on an area of the offal, the result may be to remove any offal that is less than four square inches.

The filters may be dynamic filters. As such, based on price changes of materials, the resulting standardized data may also change. For example, if the user-defined filter input remain at ten cents per offal, but the price of materials increases to $5.00 per pound, filter engine 12a may automatically filter out (i.e., remove) offals from the dataset that weigh less than 0.02 pounds. Alternatively, if the price of materials decreases to fifty cents, filter engine 12a may automatically remove offals that weigh less than 0.2 pounds.

In one embodiment, filter engine 12a may automatically standardize the offal data based on a part weight and the part's material utilization value of a blank. This filtering method may determine whether the offal of one part is reusable as a blank for another part based on part weight and the part's material utilization value. The user may or may not enter a filter value (e.g., cost). FIG. 4 illustrates this filtering method according to one of the various embodiments. It should be understood that FIG. 4 is for illustration purposes only.

As illustrated in FIG. 4, part weights and material utilization values may be determined for one or more parts. For purposes of illustration and explanation, this determination is represented as a graph. Line 50 may represent an offal reusability line. In one embodiment, line 50 may be a value determined by engine 9a. Graph area 52 may determine which parts having the part weight and material utilization falling within graph area 52 will have offals that can be reused for another part. Alternatively, graph area 54 may determine that the offals of parts having a part weight and material utilization falling within graph area 54 cannot be reused. The reusability of the offals for other parts may be based on the weight of the other parts. Based on the result, filtering engine 12a may filter the offal data according to the reusability of the offals.

For example, if Part A weighs 9 pounds with a material utilization of 85%, then the offal of Part A should not be reused for another part. Alternatively, if Part B weights nine pounds with a material utilization of 75%, the offal from Part B may be reused for another part.

In yet another embodiment, engine 9a may alternatively or additionally perform a calculation to determine the reusability of an offal. For example, engine 9a may determine the reusability of one or more offals from two parts—Part 1 and Part 2—for use in manufacturing two other parts—Part A and Part B. The smallest part (Part A) weighs two pounds and the largest part (Part B) weighs ten pounds. Part 1 may have a weight of nine pounds and a blank material utilization of 85%. The blank weight may be 10.6 pounds. Therefore, the offal weight for Part 1 may be approximately 1.6 pounds. Based on this determination, the offal from Part 1 is insufficient to use for manufacturing Part A.

Engine 9a may also determine the reusability of the offal from Part 2. Part 2 may have a weight of nine pounds and a blank material utilization of 75%. The blank weight may be approximately twelve pounds. Therefore the offal weight for Part 2 may be approximately three pounds. Based on this determination, the offal from Part 2 may be sufficient to use for manufacturing at least Part A.

Based on the reusability determination from engine 9a, filter engine 12a may filter the data set according to the offals that are reusable for other parts.

Once the offal data has been standardized, the standardized offal data may be received by database 10a as illustrated in block 32 (FIG. 2).

Referring back to FIG. 1, concurrently with or upon generating/updating and standardizing the offal data, engine 9b may generate/update and standardize one or more part groups containing parts for which the one or more offals may be used in the parts' production. The operation of the part groupings determination will be described with respect to FIGS. 5, 6a and 6b.

Figure 5:
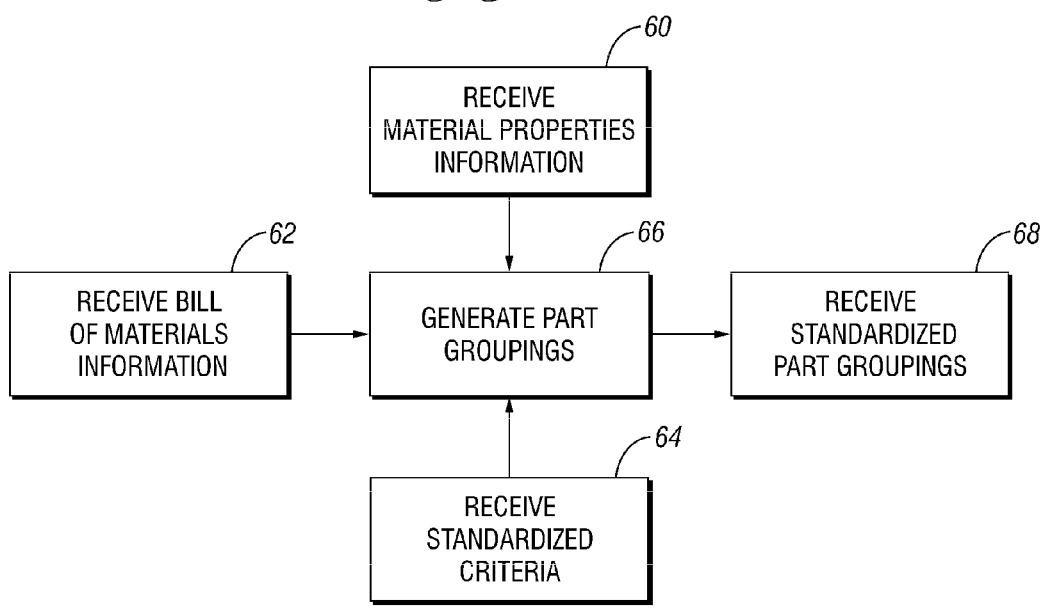
FIG. 5 illustrates a method for generating part groupings according to another one of the various embodiments.

Referring to FIG. 5, the part groupings determination may be based on information for a number of assemblies. Assembly information may include, but is not limited to, material properties information and bill of materials information.

As illustrated in block 60, the materials properties information may also be received by engine 9b. Additionally, engine 9b may receive bill of materials information as illustrated in block 62. The bill of materials information may be received from a bill of materials database (database) including the bill of materials for one or more assemblies. The part groupings may be generated based on the bill of materials information and the material properties information.

As illustrated in block 66, engine 9b may generate/update the part grouping information and store the part grouping information in database 10b. In one embodiment, portions of the data may be saved to a computer spreadsheet.

Engine 9b may also communicate with a filter engine 12b for standardizing the part groupings. It should be understood that while FIG. 1 illustrates the use of two filter engines, system 1 may include one or more filter engines. Accordingly, engine 9a and engine 9b may or may not utilize the same filter engine.

As illustrated in block 64, filter engine 12b may filter the part groupings according to various criteria inputted by a general user about one or more parts' characteristics or performance. The part grouping dataset may be filtered before or after the part grouping information is stored in database 10b. Accordingly, the part groupings information in database 10b may be the standardized part groupings.

Figures 6A, 6B:
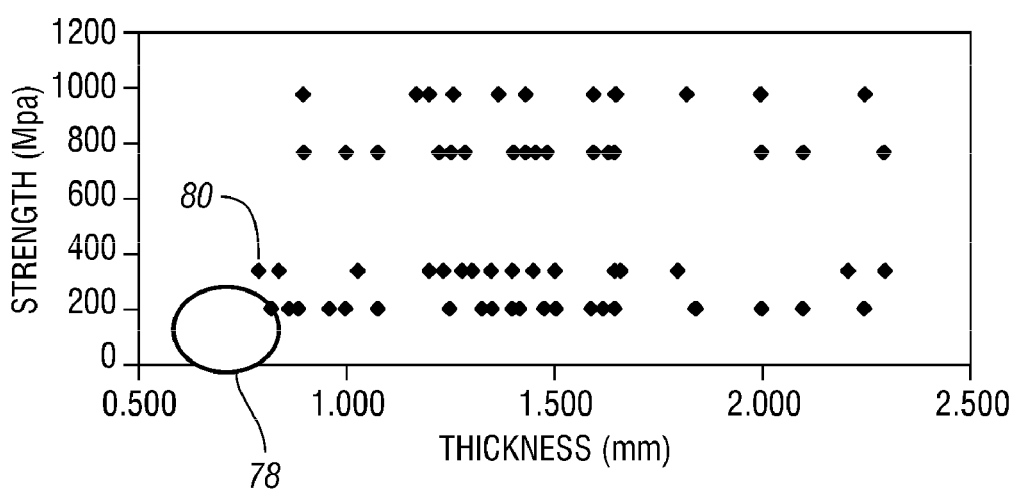
FIG. 6a illustrates a graphical user interface (GUI) for inputting standardization criteria for one or more part groupings according to one of the various embodiments.
FIG. 6b is an exemplary representation of one or more part groupings based on inputs entered by a user.

FIG. 6a illustrates the part groupings standardization criteria according to one of the various embodiments. One or more filter criteria may be submitted. Non-limiting examples may include a material utilization value for one or more parts (represented by criteria 70), part performance information (represented by criteria 72) and/or part information (represented by criteria 74). The one or more filter criteria may be submitted for filtering the part grouping data set by selecting selectable button 76 (for illustration purposes referred to as a "submit" button).

FIG. 6b is a graphical representation of part groupings based on a part's performance according to one embodiment. In this non-limiting illustration, the dataset of part groupings represents the number of parts in a particular space (e.g., and without limitation having a certain strength and thickness tolerance as illustrated in FIG. 6b). Indicator 78 represents the criteria entered by the user for standardizing the part grouping data. Indicator 78 may be a tolerance indicator identifying one or more parts falling within the tolerance entered by the user in the form represented in FIG. 6a. Data point(s) 80 represents the parts having a certain thickness and strength (as illustrative examples).

In one embodiment, the part grouping filter may be programmed to minimize the number of part groupings presented based on the filter criteria. Additionally or alternatively, the filter may be programmed to maximize the number of parts 80 within each part grouping. In a further embodiment, indicator 78 may identify at least one part 80.

Once the part groupings have been standardized, the standardized part groupings may be received by database 10b as illustrated in block 68 (FIG. 5).

Referring back to FIG. 1, the standardized offal data and the standardized part groupings data may be an input for engine 9c. The output of engine 9c may be one or more offal utilization assignments for one or more assemblies having one or more parts. The offal utilization assignments may be stored in database 10c.

Engine 9c may determine one or more offal assignments based on other information as well. For example, another input may include a blank material utilization status for one or more part assemblies. In one embodiment, the blank material utilization status for the assemblies may be updated based on the utilization status of one or more offals. The blank material utilization status information may be used to determine whether the offal of an assembly is assignable based on the assembly's material utilization status.

Another non-limiting input into engine 9c may include cost information. The cost information may be stored in a database (not shown) as one or more cost models. The cost models may determine part and tooling costs. The cost models may be generic costs models (e.g., those known in the art) and/or the models may be specifically determined by the OEM.

Engine 9c may also receive as input one or more offal utilization recommendation strategies. The recommendation strategies may be algorithms programmed as software code to one or more recommendation strategy engines (not shown) in communication with engine 9c. In one embodiment, the recommendation strategies may be programmed as algorithms to engine 9c. Furthermore, the recommendation strategies may be updated and manipulated such that strategies can be added, deleted or revised.

Non-limiting examples of utilization recommendation strategies include (A) die-in-die parts, (B) offal as blanks, (C) increasing blank size, (D) tailor welded blanks using offal pieces, (E) multi-parts in lieu of a single part, (F) gage/grade changes, and (G) supplier changes. The utilization of these strategies may be customized by the general user. For example, the user may rank the order in which each utilization recommendation strategy is used. Additionally, the general user may set one or more recommendation strategies to be used sequentially or concurrently (i.e., in parallel).

In one embodiment, the user may activate both preferences. For example, the user may set the following strategy utilization order: (1) B, (2) A, (3) C, (3) D, (4) G, (5) E, (5) F. Thus, in this example, strategy B is performed first, strategy A is performed second, strategies C and D are performed third (i.e., concurrently), strategy G is performed fourth, and strategies E and F are performed fifth (i.e., concurrently). It should be understood that this example is for illustration purposes and non-limiting. Furthermore, the letter assignments are for assisting in illustration of this embodiment and should not be construed as limiting.

FIG. 7 illustrates the operation of the offal utilization assignment engine according to one of the various embodiments. The standardized offal information and standardized part groupings may be received as illustrated in blocks 90 and 92, respectively. The blank material utilization status of one or more parts may also be received as illustrated in block 94. Additionally, the recommendation strategies may also be received as illustrated in block 96.

A determination may be made at block 100 as to whether there is a user-defined sequence for applying the recommendation strategies. If a user-defined sequence does not exist, a default sequence may be applied as illustrated in block 102. The default sequence may be defined by the OEM. If a user-defined sequence does exist, the sequence may be retrieved as illustrated in block 104. Upon receipt of the user-sequence, the user-defined recommendation strategy sequence may be used as illustrated in block 106.

Upon determining the sequence to use (whether default or user-defined), one or more of the offal utilization assignments may be recommended as illustrated in block 108.

In one embodiment, the cost information (i.e., one or more cost models) may also be received, as illustrated in block 110, for recommending one or more offal utilization assignments. As described above, the recommendation strategies may be performed sequentially or in parallel (whether or not the sequence is user-defined or a default). In either case, cost information may determine the order of results presented to the user. For example, if two recommendation strategies are performed concurrently, a cost benefit analysis may be performed to determine which strategy maximizes the offal utilization based on cost. Additionally, if after performing a sequential sequence, two recommendation strategies produce similar results, a cost-benefit analysis may be performed to determine which result maximizes the offal utilization based on cost.

Referring back to FIG. 1, Engine 9*d* may be a reporting engine communicating with one or more of engines 9*a*, 9*b*, and/or 9*c* for receiving data to generate one or more reports. For example, the engine 9*d* may communicate with engine 9*a* for generating a report on the offal data. Additionally or alternatively, engine 9*d* may communicate with engine 9*b* for reporting alterations to bill of materials requirements based on the offal utilization recommendations. Additionally or alternatively, engine 9*d* may communicate with engine 9*c* for reporting on the one or more offal utilization assignments or the material utilization values for one or more parts or assemblies.

It should be understood that engine 9*d* may communicate with engines 9*a-c* individually or in combination. For example, in reporting on alterations to bill of materials requirements, engine 9*d* may also communicate with engine 9*a* to receive offal data and 9*c* to receive one or more cost models. In this non-limiting scenario, assigning an offal to a particular part or assembly may or may not cause a change in the bill of materials for the original assembly. For example, the assigned offal may be greater in weight than the original part which may suggest a need for a change in the bill of materials for the original assembly to accommodate for the material difference. Accordingly, a cost-benefit analysis may be performed by engine 9*d* to assess whether, for example, a change in tooling to accommodate for the use of the offal makes financial sense.

Operation of the reporting engine will be described with respect to FIG. 8. As illustrated in block 120, the standardized offal information may be received by engine 9*d*. Additionally, a material utilization status of one or more part assemblies may also be received as illustrated in block 122. The bill of materials information for the one or more assemblies may also be received as illustrated in block 124. Upon receipt, one or more reports may be generated by engine 9*d* as illustrated in block 126 based on one or more of the offal information, bill of materials information and the material utilization status information. That is, one report may be generated detailing the offal information such as weight, area, perimeter, etc. (as described above). Additionally or alternatively, multiple reports may be generated including the bill of materials information, the offal information and the material utilization status.

In one embodiment, a determination may be made whether a change to the bill of materials information is required. Upon receiving the bill of materials information of the original assembly (block 124), the status of the bill of materials may be determined, as illustrated in block 132, based on the offal utilization assignment. Accordingly, engine 9*d* may determine if the bill of materials status has changed as illustrated in block 134.

If the use of the offal according to the offal utilization assignment does not change the bill of materials for the assembly, the original bill of materials may be used as illustrated in block 136. The report may include the original bill of materials information.

If use of the offal does result in a change to the bill of materials, the cost information may be received for performing the cost-benefit analysis as illustrated in block 138. The cost-benefit analysis may be performed based on the cost information as illustrated in block 140. Other non-limiting business rules on which the cost-benefit analysis may be based include logistics information and/or supplier information. For example, if a particular offal, which may come from one supplier, can be used in a part made by another supplier, the cost-benefit analysis may also include determining the effect of transporting the offal or resourcing the part against the savings achieved by using the offal.

A determination may be made whether, based on the cost-benefit analysis, a change in bill of materials is cost-effective as illustrated in block 142. If the change is not cost-effective, the original bill of materials may be used as illustrated in block 136. Alternatively, a new offal assignment may be made for the assembly. The bill of materials information may then be included in the report(s) as illustrated in block 126.

If the change is cost-effective, new bill of materials information be generated as illustrated in block 144. The bill of materials information may then be included in the report(s) as illustrated in block 126.

As illustrated in block 128, data may be transmitted over network 7 for displaying the report(s) at terminal 3. The data may be transmitted in response to a user command sent to server 5 or automatically from server 5. As illustrated in block 130, the report(s) may be displayed at terminal 3 for display to the general user.

In one embodiment, system 1 may interface (i.e., share data) with one or more tools in the sourcing, design and manufacturing of part assemblies. The interface may be a web-based interface and each tool may communicate with each other over any communication network (e.g., and without limitation, the Internet and/or an Intranet). For example, data that may be shared bi-directionally between system 1 and other tool(s) include, but are not limited to, the materials properties information, the cost information, supplier information, and vehicle program information.

System 1 may also share functionality with one or more other tool(s). For example, engine 9*c* may communicate with a part material optimization tool for recommending one or more offal utilization assignments. In doing so, engine 9*c* may communicate with the part material optimization tool to determine if changes in a grade or gauge of one or more parts results in equivalent or better performance for the part. Additionally or alternatively, the part material optimization tool may communicate with system 1 to determine if one or more offals may be used as a blank for one or more parts.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed:

1. A computer-implemented method for determining a material utilization for one or more assemblies having a plurality of parts, the method comprising:
   receiving offal data for one or more parts comprising one or more part assemblies;
   receiving a blank material utilization status for each of the one or more part assemblies based on a blank material utilization status for each of the one or more parts;
   standardizing the offal data to obtain standardized offal data;
   receiving a plurality of input offal utilization assignment strategies, wherein the strategies are further ranked;
   determining one or more offal utilization assignments for the one or more part assemblies having a plurality of parts based on the standardized offal data, the blank material utilization status for the one or more part assemblies, and at least one of the utilization assignment strategies, wherein the utilization assignment strategies are applied based on order of ranking; and
   transmitting the one or more offal utilization assignments for assignment to the one or more part assemblies.

2. The computer-implemented method of claim 1 wherein the determining step is performed during a design phase of one or more vehicles.

3. The computer-implemented method of claim 1 wherein the one or more part assemblies are for different vehicle programs.

4. The computer-implemented method of claim 1 wherein the standardizing step further comprises standardizing the offal data in response to one or more user inputs to obtain standardized offal data.

5. The computer-implemented method of claim 4 wherein the one or more user inputs includes one or more criteria for standardization, wherein determining the one or more offal utilization assignments based on the standardized offal data includes determining the offal utilization assignments based on the standardization criteria.

6. The computer-implemented method of claim 1 further comprising:
   receiving data representing one or more part groupings;
   standardizing the part groupings data to obtain standardized part groupings data; and
   determining the one or more offal utilization assignments additionally based on the standardized part groupings data.

7. The computer-implemented method of claim 6 wherein the standardizing step include standardizing the part groupings data in response to one or more user inputs.

8. The computer-implemented method of claim 7 wherein the one or more user inputs include one or more part grouping tolerances.

9. The computer-implemented method of claim 8 wherein the one or more part grouping tolerances include at least one of a thickness tolerance and a strength tolerance.

10. The computer-implemented method of claim 1 further comprising performing the one or more offal utilization assignment strategies sequentially or in parallel.

11. A computer-implemented system for maximizing a material utilization for one or more assemblies having a plurality of parts, the system comprising:
    at least one computer configured to:
       receive offal data for one or more parts related to one or more part assemblies;
       receive a blank material utilization status for each of the one or more part assemblies based on a blank material utilization status for each of the one or more parts;
       receive data representing one or more part groupings;
       standardize the offal data and the part groupings data to obtain standardized offal data and standardized part groupings data;
       receive a plurality of input offal utilization assignment strategies, wherein the strategies are further ranked;
       determine one or more offal utilization assignments for one or more part assemblies having a plurality of parts based on the standardized offal data, the standardized part groupings data, the blank material utilization status of the one or more part assemblies, and at least one of the utilization assignment strategies, wherein the utilization assignment strategies are applied based on order of ranking; and
       transmit the one or more offal utilization assignments for assignment to the one or more part assemblies.

12. The computer-implemented system of claim 11 wherein the at least one computer is further configured to:
    receive cost information for manufacturing the one or more part assemblies; and
    determine the one or more offal utilization assignments for the one or more part assemblies based on the standardized offal data, the standardized part groupings data, the blank material utilization status, and the cost information.

13. The computer-implemented system of claim 12 wherein the cost information includes at least one of a parts cost, a tooling cost, and a transportation cost.

14. The computer-implemented system of claim 11 wherein the at least one computer is further configured to:
    receive bill of materials information for the one or more assemblies;
    receive one or more offal utilization assignment strategies for use in determining the one or more offal utilization assignments;
    apply the one or more offal utilization assignment strategies;
    for each offal utilization assignment strategy, determine if the bill of materials information needs revision; and
    revise the bill of materials information if revision is needed.

15. The computer-implemented system of claim 11 wherein the at least one computer includes a plurality of computers communicating in a distributed computing system.

16. The computer-implemented system of claim 11 wherein the offal data is computer-aided design (CAD) data.

17. The computer-implemented system of claim 11 wherein the at least one computer configured to receive the offal data is further configured to update the offal data.

18. A tangible computer program product embodied in a non-transitory computer-readable medium for maximizing a material utilization comprising instructions for:
    receiving an assembly blank material utilization (BMU) status based on a part BMU status;
    receiving offal data for one or more parts;
    standardizing the offal data;
    receiving the standardized offal data;
    receiving a plurality of input offal utilization assignment strategies, wherein the strategies are further ranked; and
    determining an offal utilization assignment for one or more part assemblies based on the standardized offal data, the assembly BMU status, and at least one of the utilization assignment strategies, wherein the utilization assignment strategies are applied based on order of ranking.

* * * * *